United States Patent [19]

Snider et al.

[11] Patent Number: 5,729,752
[45] Date of Patent: Mar. 17, 1998

[54] NETWORK CONNECTION SCHEME

[75] Inventors: Gregory S. Snider, Mountain View; Philip J. Kuekes, Atherton, both of Calif.

[73] Assignee: Hewlett-Packard Company, Palo Alto, Calif.

[21] Appl. No.: 19,499

[22] Filed: Feb. 19, 1993

[51] Int. Cl.[6] .................................................. G06F 1/00
[52] U.S. Cl. .................................................. 395/800
[58] Field of Search ................................ 395/800.01

[56] References Cited

U.S. PATENT DOCUMENTS

| 3,308,436 | 3/1967 | Borck et al. | 395/800 |
| 5,036,473 | 7/1991 | Butts et al. | 364/489 |

*Primary Examiner—David Y. Eng*

[57] ABSTRACT

A network connection scheme for a direct or an indirect network. The network is implemented in two levels of circuit boards. Every board in the first level crosses all the boards in the second level, with every processor in the first level circuit board coupled to at least two processors that are on two second level circuit boards. This scheme significantly reduces the difficulty in implementing the network.

16 Claims, 4 Drawing Sheets

NETWORK CONNECTION SCHEME

BACKGROUND OF THE INVENTION

The present invention relates generally to networks and more particularly to a connection scheme for a network. Interconnecting processors in a network becomes a very complex problem as the number of processors increases. Processors are either connected directly as in a direct network or indirectly as in an indirect network. For a direct network, as the number of processors increases, passing information from one processor to the next might require the information to go through many other intermediate processors. This significantly increases the delay time to pass the information.

An indirect network connects one processor to another through switches to alleviate the delay problem. Numerous processors are connected to a switch which passes information from one processor to the next without requiring the information to go through many intermediate processors. Redundant switches are usually put into the network to prevent the "bottleneck" problem where many processors are trying to access one switch at the same time.

For both direct and indirect networks where each processor has to communicate with many other processors, the difficulty of wiring the processors together dramatically increases as the number of processors increases. Implementing a complex network sometimes turns out to be an unmanageable problem with wires ending up crossing everywhere.

FIG. 1 shows a prior art connection scheme for a network with eight circuit boards, 10 to 17. The processors and switches on each board are not shown. Each board has four connectors; for example, the board 17 has connectors 20 to 23. Each of the four boards 10 to 13 is connected to each of the other four boards 14 to 17 through 16 channels; for example, a connector 25 in the board 10 is connected to a connector 26 in the board 14 through a channel 27. Each channel can carry thousands of wires. Such networks are very difficult to implement.

There is a need for a connection scheme to systematically build a complex network.

SUMMARY OF THE INVENTION

The invention provides a connection scheme that systematically builds a network. The network is divided into two levels of circuit boards which are arranged such that every board in one level crosses every board in the other level. Every processor in one level is coupled to at least two processors in the other level.

In a preferred embodiment, a network is implemented with a number of first level circuit boards and a number of second level circuit boards. Each board has at least one processor. Every processor in the first level circuit board is coupled to at least two processors that are on two second level circuit boards. Every board has a connecting edge. The connecting edge of each first level board crosses the connecting edges of all the second level boards. The systematic nature of organizing the boards to connect the processors tremendously simplifies implementing the network.

The invention is applicable to both direct networks and indirect networks.

Other aspects and advantages of the present invention will become apparent from the following detailed description, taken in conjunction with the accompanying drawings, illustrating by way of example the principles of the invention.

DESCRIPTION OF THE PREFERRED EMBODIMENT

The invention provides a connection scheme to build a direct or an indirect network. A network based on this invention connects numerous processors in a very systematic manner. The network is implemented in two levels of circuit boards. The levels are arranged so that every board in one level crosses every board in the other level. This configuration tremendously reduces the difficulty in implementing the network.

Figure 1:
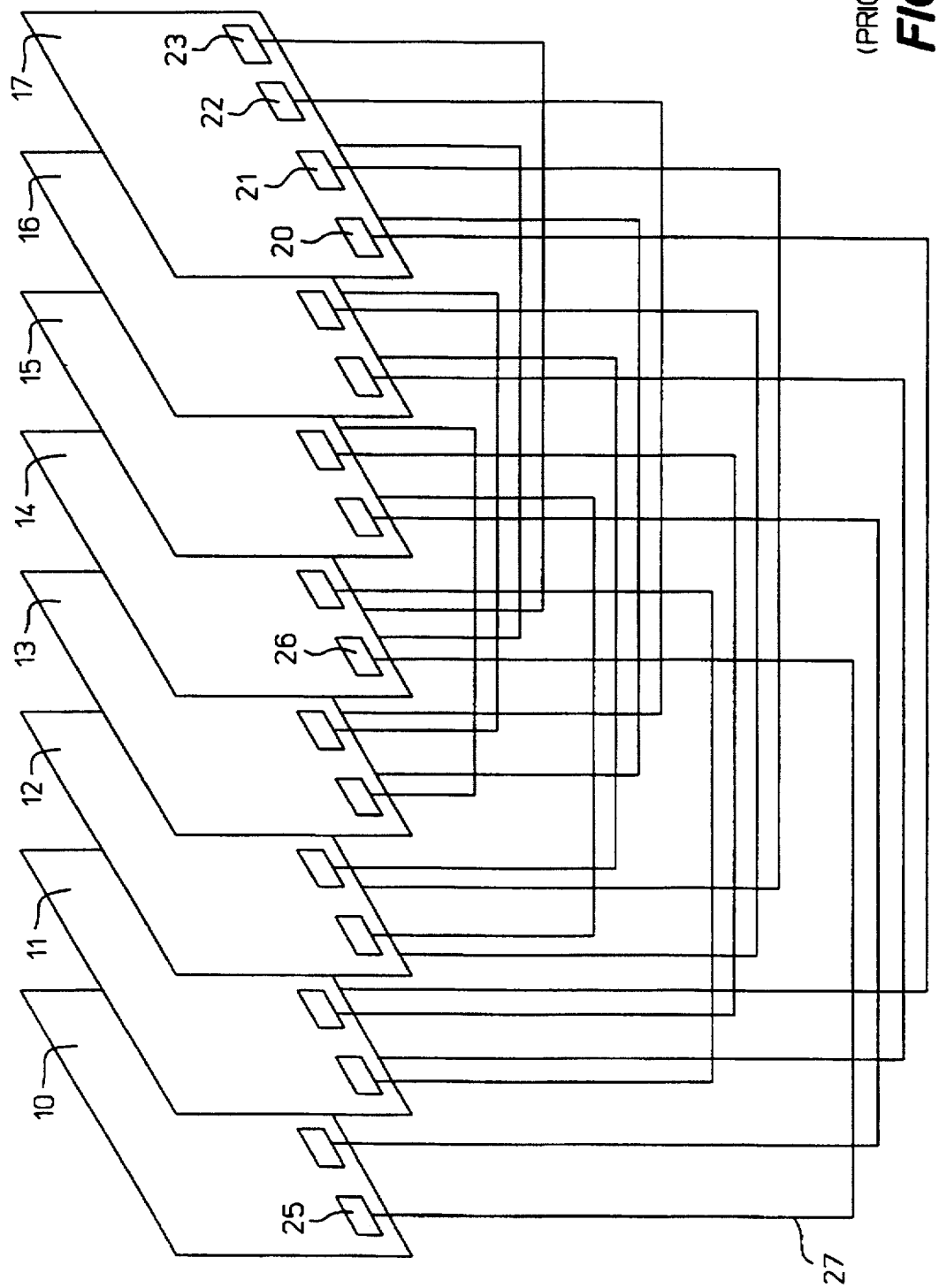
FIG. 1 shows a prior art connection scheme for a network.
Figure 2A:
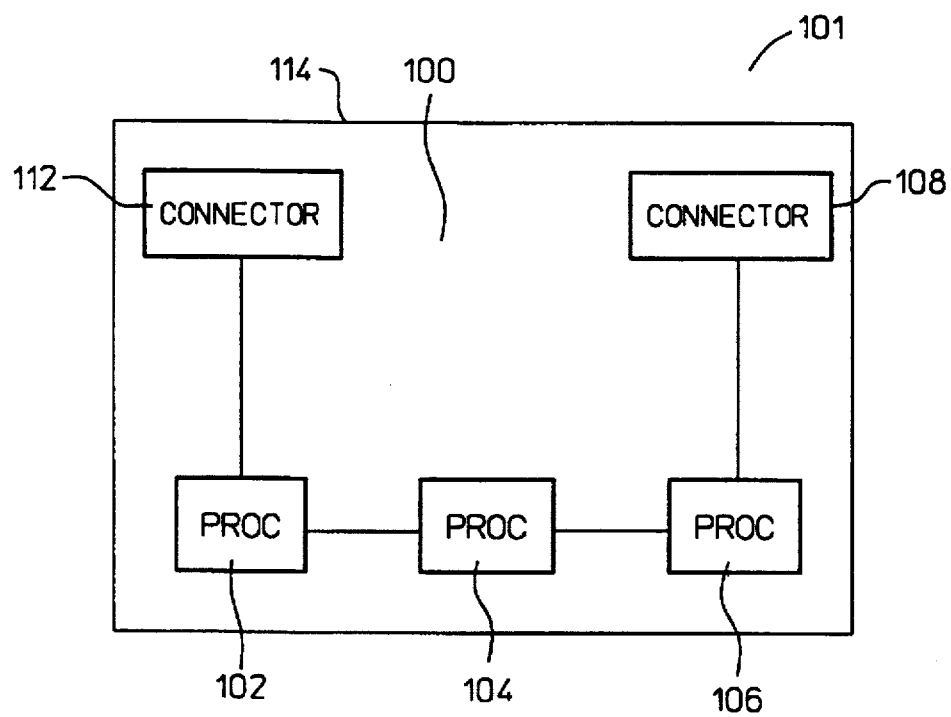
FIGS. 2A and 2B illustrate prior art direct and indirect network circuit boards respectively.

FIG. 2A illustrates a prior art circuit board 101 implementing a direct network 100. The board 101 has three processors, 102, 104 and 106, which perform the functions of processing information, and switching or passing information among the processors. The board 101 also has two connectors, 108 and 112. All the connectors are positioned along a connecting edge 114 of the board 101.

Figure 2B:
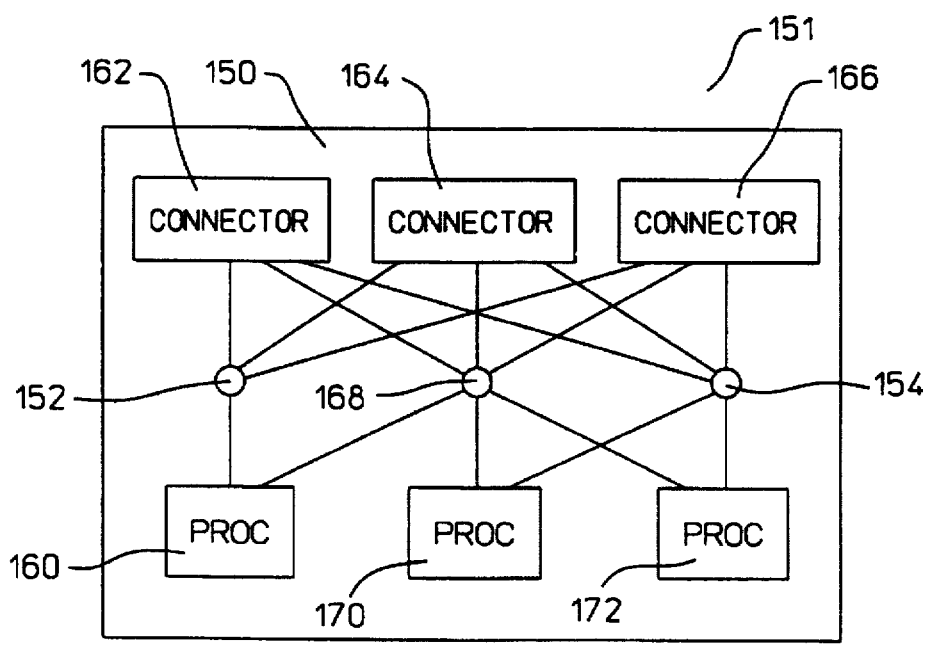

FIG. 2B illustrates a prior art circuit board 151 implementing an indirect network 150. In addition to processors 160, 170 and 172 and connectors 162, 164 and 166, the board 151 has three switches, 152, 154 and 168 to pass information among the processors. Each processor is connected to at least one switch; for example, the processor 160 is connected to the switch 152. Each connector is also connected to at least one switch; for example, the connector 162 is connected to the switch 152.

A network in the present invention does not have to include all the processors and connectors in a system. Similarly, the network does not have to include all the switches in the system.

Figure 3:
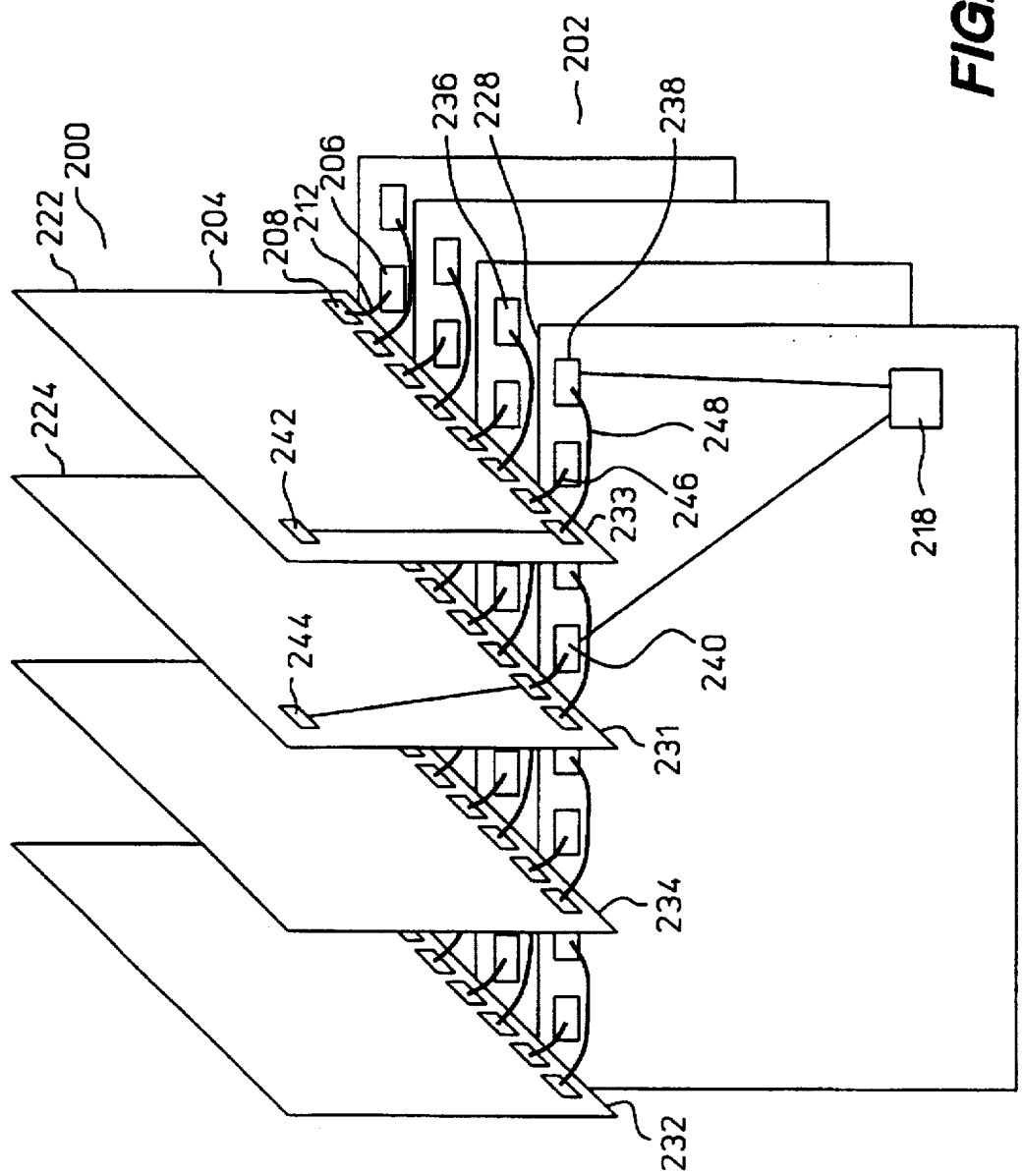
FIG. 3 shows a preferred embodiment of the invention.

FIG. 3 shows a preferred embodiment of the invention. The network 200 is implemented in two levels of circuit boards, a first level 202 and a second level 204. Each circuit board has processors and connectors as in FIG. 2A and may also have switches as in FIG. 2B. Every processor in the first level circuit board 202 is coupled to processors in more than one second level circuit board; for example, the processor 218 is coupled to two processors 242, 244 in two second level circuit boards 222 and 224.

In another embodiment, there are intermediate processors for a direct network, and there are switches for an indirect network among the processors and the connectors. All the processors in a board may be coupled together through the switches in that board, or all the processors in a board may be coupled directly or indirectly to all the connectors in that board.

The connecting edge of each first level circuit board crosses the connecting edges of all the second level circuit boards. For example, the connecting edge 228 of the first level circuit board 226 crosses the connecting edges 231, 232, 233 and 234 of the second level circuit boards approximately at right angle. The angle of crossing can be different from 90°.

Each connector in a first level circuit board is connected to one connector in a second level circuit board by a channel; for example, the connector 206 is connected to the connector 208 through the channel 212. Each channel connects the two connectors that are substantially closest to each other to substantially minimize the total length of all the channels connecting all the connectors. For example, the connector 208 is connected to the connector 206 but not to the connector 236.

The channel can be a flat cable, a coaxial cable or other interconnecting mechanism including fiber optics connections. Each channel can carry thousands of interconnects or wires.

The number of connectors in one level is less than or equal to the number of connectors in the other level. Not all the connectors in one level have to be connected to connectors in the other level. In the specific example shown in FIG. 2, every board has 8 connectors, and both levels have four boards. This leads to the two levels having the same number of connectors, both being 32; and all the connectors in one level are connected to connectors in the other level.

For the embodiment shown in FIG. 3, every first level board is connected to every second level board by two channels; for example, the first level board 226 is connected to the second level board 222 by channels 246 and 248.

In another embodiment, every first level board is connected to every second level board by one channel so that the number of connectors in every board is equal to the number of boards in each level.

Figure 4:
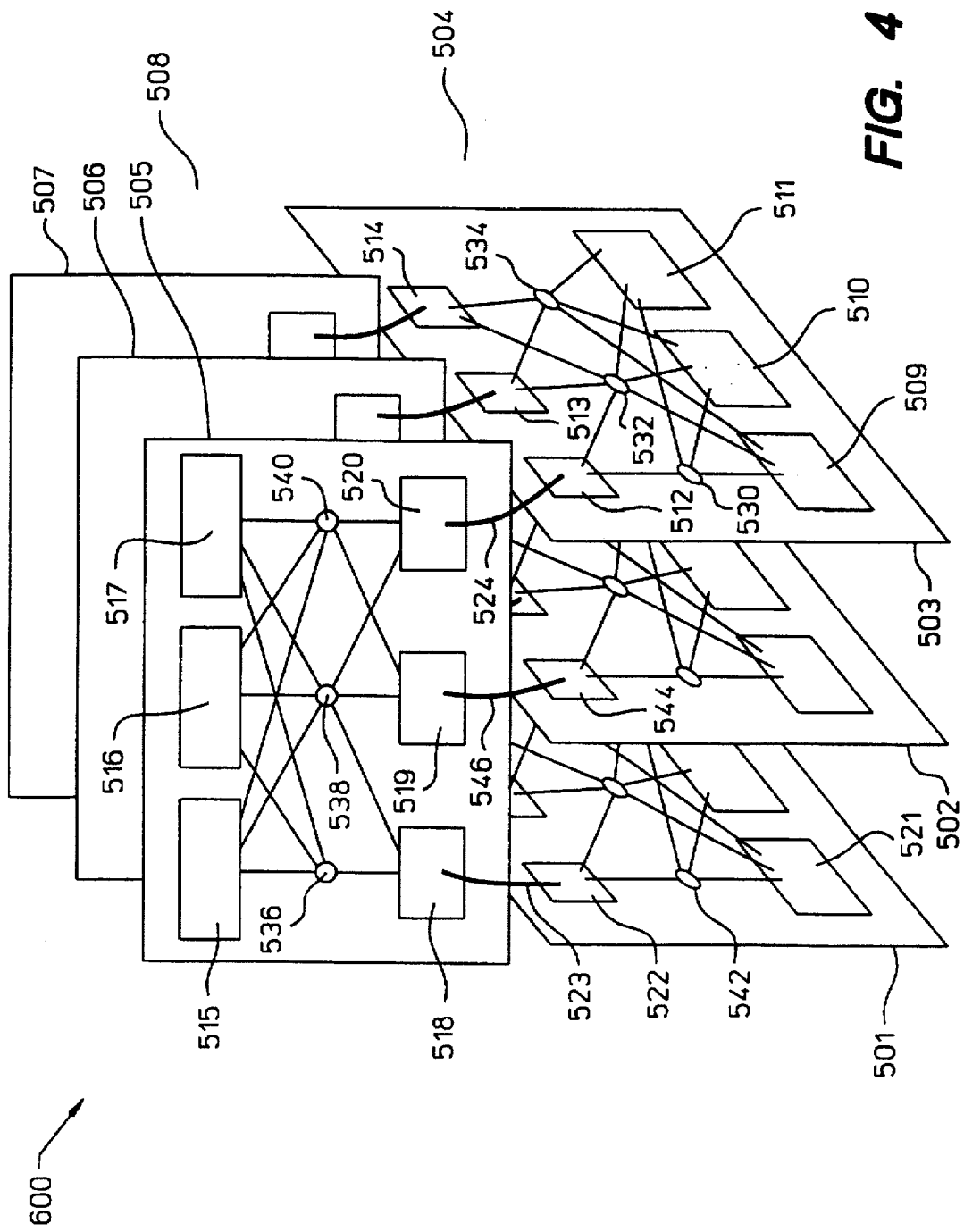
FIG. 4 shows how the processors are coupled together in one embodiment of the invention.

FIG. 4 illustrates one way the processors may be coupled together according to the invention. Three circuit boards 501, 502 and 503 are arranged into a first level 504, and three more boards 505, 506 and 507 are arranged into a second level 508 to form the network 600. Every board in the first level is connected to every board in the other level through one channel.

In this specific example, all the boards are substantially identical, but the invention is applicable to boards that are all different. Each board shown in FIG. 4 carries three processors, three switches and three connectors; for example, the first level board 503 carries processors 509, 510 and 511, switches 530, 532 and 534 and connectors 512, 513 and 514; and the second level board 505 carries processors 515, 516 and 517, switches 536, 538 and 540 and connectors 518, 519 and 520.

Each processor on a board is coupled to all the connectors on that board through switches. In turn, each connector on a board in one level is connected to its substantially closest connector on a board in the other level to establish a direct path between any first level board and any second level board. For example, the connectors 518, 519 and 520 on the second level board 505 are connected to the connectors 522, 544 and 512 on the first level boards 501, 502 and 503 through channels 523, 546 and 524 respectively.

Information can travel from any processor to any other processor by traversing, at most, one intermediate board. For example, a piece of information from the processor 521 on the first level board 501 can travel to any processor on any of the second level boards without traversing any intermediate boards and to any processor on any other first level board by traversing one second level board. One path for the information from the processor 521 to reach the processor 509 could be through the switch 542 and the connector 522 to the second level board 505, and then through the circuitry on that board to the connector 520, and finally from there to the processor 509 on the first level board 503.

Thus a piece of information going from one processor to any other processor at most only has to pass through one intermediate board. This connection scheme works for both direct and indirect networks and is fully expandable as the number of processors in the networks increases.

The invention tremendously simplifies the hardware implementation of a network. For example, in designing a network for a massively parallel computer system with 128 processors, one only needs to design one board of indirect network with 4 processors all indirectly coupled to each other through switches. Then reproduce 32 of such boards, divide them into 2 equal sets, stack one set over the other and connect the connectors from the two sets that are closest to each other as in FIG. 4. The network is implemented. Every one of those 128 processors is coupled to every other one. The speed of mapping a design to a hardware is tremendously simplified, and the cost of manufacturing such a network is reduced.

A connection scheme for a direct or an indirect network has been invented. With this scheme, the implementation process for the network has been significantly simplified.

We claim:

1. A network comprising:
   a plurality of first level circuit boards, each board physically having a connecting edge and at least one processing means; and
   a plurality of second level circuit board, each board physically having a connecting edge and at least one processing means;
   wherein:
   the connecting edge of each first level circuit board physically crosses the connecting edges of all the second level circuit boards; and
   every processing means in a first level circuit board is coupled to at least two processing means that are on two second level circuit boards.

2. A network as recited in claim 1 further comprising:
   at least one connecting means in each circuit board, each connecting means coupled to at least one processing means in that board, and the connecting means being positioned along the connecting edge of that board; and
   a plurality of channels, each connecting means in a first level circuit board being connected to one connecting means in a second level circuit board by one of the channels.

3. A network as recited in claim 2, wherein:
   the number of first level circuit boards is equal to the number of connecting means in each second level circuit board; and
   the number of second level circuit boards is equal to the number of connecting means in each first level circuit board.

4. A network as recited in claim 2 wherein every processing means on each board is coupled to all the connecting means on that board.

5. A network as recited in claim 2 wherein:
   every connecting means in the first level board is substantially closest to a connecting means in the second level board; and
   every channel connects the two connecting means that are substantially closest to each other so that the total length of the channels connecting all the connectors is substantially minimized.

6. A network as recited in claim 2 wherein all the circuit boards are substantially identical such that all the boards are interchangeable.

7. A network as recited in claim 2 wherein each first level board crosses approximately at right angle to each second level board.

8. A network as recited in claim 7 wherein:

every connecting means in the first level board is substantially closest to a connecting means in the second level board; and every channel connects the two connecting means that are substantially closest to each other so that the total length of the channels connecting all the connectors is substantially minimized.

9. A network as recited in claim 8 wherein all the circuit boards are substantially identical such that all the boards are interchangeable.

10. A network as recited in claim 2 further comprising at least one switching means on each board, each processing means connected to at least one switching means, and each connecting means connected to at least one switching means so that a plurality of processing means in each board may be coupled together through a switch in that board.

11. A network as recited in claim 10 wherein for every circuit board, all the processing means are coupled together through the switching means on that board.

12. A network as recited in claim 10 wherein all the circuit boards are substantially identical such that all the boards are interchangeable.

13. A network as recited in claim 10 wherein:

every connecting means in the first level board is substantially closest to a connecting means in the second level board; and every channel connects the two connecting means that are substantially closest to each other so that the total length of the channels connecting all the connectors is substantially minimized.

14. A network as recited in claim 10 wherein each first level board crosses approximately at right angle to each second level board.

15. A network as recited in claim 14 wherein:

every connecting means in the first level board is substantially closest to a connecting means in the second level board; and every channel connects the two connecting means that are substantially closest to each other so that the total length of the channels connecting all the connectors is substantially minimized.

16. A network as recited in claim 15 wherein all the circuit boards are substantially identical such that all the boards are interchangeable.

* * * * *